United States Patent
Chinniah et al.

(10) Patent No.: US 9,065,026 B2
(45) Date of Patent: Jun. 23, 2015

(54) LENS ELEMENT FOR DISTRIBUTING LIGHT WITH A UNIFORM INTENSITY DISTRIBUTION AND LIGHTING DEVICE COMPRISED THEREOF

(71) Applicant: GE LIGHTING SOLUTIONS, LLC, East Cleveland, OH (US)

(72) Inventors: Jeyachandrabose Chinniah, Willoughby Hills, OH (US); Glenn Howard Kuenzler, Beachwood, OH (US); Jeremias Anthony Martins, Twinsburgh, OH (US); Benjamin Lee Yoder, Cleveland Heights, OH (US)

(73) Assignee: GE LIGHTING SOLUTIONS, LLC, East Cleveland, OH (US)

( * ) Notice: Subject to any disclaimer, the term of this patent is extended or adjusted under 35 U.S.C. 154(b) by 0 days.

(21) Appl. No.: 13/960,916

(22) Filed: Aug. 7, 2013

(65) Prior Publication Data
US 2015/0041837 A1    Feb. 12, 2015

(51) Int. Cl.
| | |
|---|---|
| H01L 33/58 | (2010.01) |
| F21V 5/04 | (2006.01) |
| F21V 29/00 | (2015.01) |
| F21K 99/00 | (2010.01) |
| G02B 19/00 | (2006.01) |

(52) U.S. Cl.
CPC . *H01L 33/58* (2013.01); *F21V 5/04* (2013.01); *F21V 29/00* (2013.01); *F21K 9/135* (2013.01); *F21K 9/30* (2013.01); *F21K 9/50* (2013.01); *G02B 19/0061* (2013.01)

(58) Field of Classification Search
CPC .................................. H01L 33/58; F21V 5/04
USPC ................................................. 257/98; 438/27
See application file for complete search history.

(56) References Cited

U.S. PATENT DOCUMENTS

| | | | |
|---|---|---|---|
| 5,150,966 | A | 9/1992 | Nelson |
| 7,832,896 | B2 | 11/2010 | Saha et al. |
| 8,070,326 | B2 | 12/2011 | Lee |
| 2006/0083000 | A1 * | 4/2006 | Yoon et al. ..................... 362/311 |
| 2010/0073927 | A1 | 3/2010 | Lewin et al. |
| 2010/0302786 | A1 | 12/2010 | Wilcox et al. |
| 2012/0268950 | A1 | 10/2012 | Parkyn et al. |
| 2013/0083541 | A1 * | 4/2013 | Fang et al. ............... 362/311.02 |

OTHER PUBLICATIONS

PCT Search Report and Written Opinion issued in connection with corresponding WO Application No. PCT/US2014/047348 dated Oct. 31, 2014.

* cited by examiner

*Primary Examiner* — Roy Potter
*Assistant Examiner* — Paul Patton
(74) *Attorney, Agent, or Firm* — GE Global Patent Operation; Peter T. Dimauro

(57) ABSTRACT

Embodiments of a lens element have a body that incorporates geometry that defines features for surfaces that receive and transmit light, e.g., from a light emitting diode (LED) device. These features include, for example, curves, bends, arcs, and like curvilinear objects and/or shapes. These embodiments employs these features to change the direction of light that transits the body. These changes can reflect, refract, and/or re-direct light, thus rendering light that emits from the lens element with one or more light distributing characteristics. In one embodiment, the body comprises a cavity with an inner surface that has a first section and a second section that curve, respectively, with positive concavity and with negative concavity relative to the LED device.

14 Claims, 7 Drawing Sheets

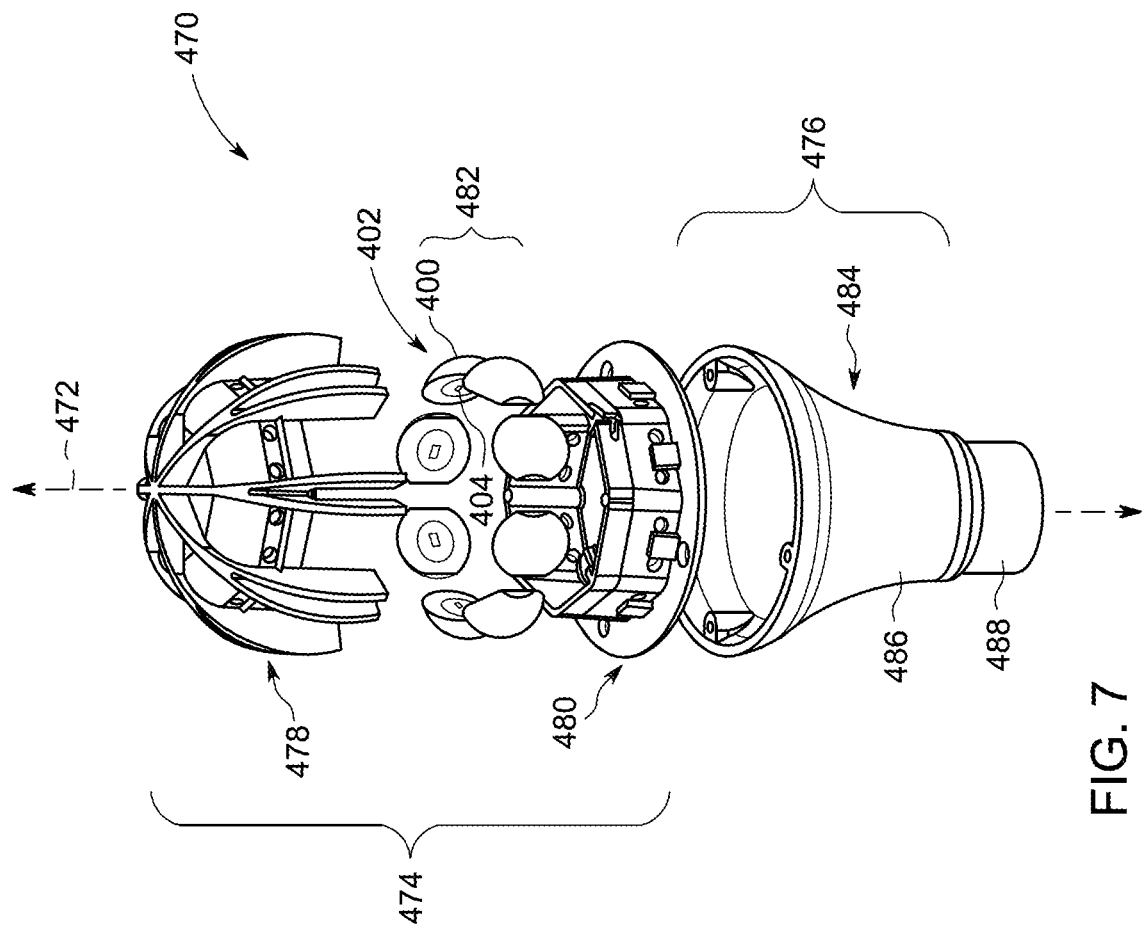

ND LIGHTING DEVICE
LENS ELEMENT FOR DISTRIBUTING LIGHT WITH A UNIFORM INTENSITY DISTRIBUTION AND LIGHTING DEVICE COMPRISED THEREOF

BACKGROUND

The subject matter of the present disclosure relates to illumination arts, lighting arts, solid-state lighting arts, and related arts.

Various types of incandescent lamps (e.g., integral incandescent lamps and halogen lamps) mate with a lamp socket via a threaded base connector (sometimes referred to as an "Edison base" in the context of an incandescent light bulb), a bayonet-type base connector (e.g., a bayonet base in the case of an incandescent light bulb), or other standard base connector. These lamps often form a unitary package, which includes components to operate from standard electrical power (e.g., 110 V and/or 220 V AC and/or 12 VDC). In the case of incandescent and halogen lamps, these components are minimal, as the lamp comprises an incandescent filament that operates at high temperature and efficiently radiates excess heat into the ambient. Many incandescent lamps are omni-directional light sources. These types of lamps provide light of substantially uniform optical intensity distribution (or, "intensity distribution"). Such lamps find diverse applications such as in desk lamps, table lamps, decorative lamps, chandeliers, ceiling fixtures, and other applications where a uniform distribution of light in all directions is desired.

Developments in lamp and lighting technology continue to introduce solid-state devices to generate light. The performance of solid-state lighting technologies (e.g., light-emitting diode (LED) devices) is often superior to incandescent and halogen lamps in terms of, for example, useful lifetime (e.g., lumen maintenance and reliability over time) and higher efficacy (e.g., Lumens per Electrical Watt (LPW)). Whereas the lifetime of incandescent lamps is typically in the range of about 1000 to 5000 hours, lighting devices that use LED devices can operate in excess of 25,000 hours, and perhaps as much as 100,000 hours or more. In terms of efficacy, incandescent and halogen lamps are typically in the range of 10-30 LPW, while lamps with LED devices can have efficacy of 40-100 LPW with anticipated improvements that will raise efficacy even higher in the future.

Unfortunately, many LED devices are typically highly directional by nature. Common LED chips are flat and emit light from only one side. Thus, although superior in performance, many commercially-available LED lamps cannot achieve the uniform distribution found in conventional lamps. In some applications, the requirement for 40, 60, 75 and 100 watt equivalent LED lamps to replace conventional incandescent lamps specifies that the lamp must generate light with uniform intensity from 0-135 degrees in the latitude direction.

Moreover, lamps that use solid-state technology must be equipped to adequately dissipate heat. LED devices are highly temperature-sensitive in both performance and reliability as compared with incandescent or halogen filaments. These sensitivities are often addressed by placing a heat sink in contact, or in thermal contact, with the LED device. However, the heat sink may block light that the LED device emits and hence further limits the ability to generate light of uniform intensity distribution. Physical constraints such as regulatory limits that define maximum dimensions for all lamp components, including light sources, further limit that ability to properly dissipate heat.

BRIEF SUMMARY OF THE INVENTION

The present disclosure describes, in one embodiment, a lighting device, comprises a light source that comprises a light emitting diode (LED) device with an optical axis and a lens element proximate the LED device. The lens element has a base, an inner surface, and an outer surface, the inner surface and the outer surface defining a material thickness for the lens element. The inner surface has a first section that curves with positive concavity relative to the LED device and a second section that curves with negative concavity relative to the LED device. In one example the material thickness increases between the inner surface and the outer surface increases from a first value proximate the optical axis to a second value that forms a thickness ratio with the first value in a range from about 2.4 to about 3.6 and decreases from the second value to a third value that is less than the second value proximate the base of the lens element.

The present disclosure also describes, in one embodiment, a lighting device comprises a light emitting diode (LED) device with an optical axis and a lens element disposed in position to receive light from the LED device on a first surface. The first surface has a first section curving with positive concavity relative to the LED device and a second section that curves with negative concavity relative to the LED device. In one example, the lens element has a material thickness that separates the first surface from a second surface. The material thickness increases from a first value at the optical axis to a second value that forms a thickness ratio with the first value in the second section in a range from about 2.4 to about 3.6.

The present disclosure further describes, in one embodiment, a lens for use in a lighting device to distribute light from a light emitting diode (LED) device with uniform intensity. The lens comprises a body comprising an optically clear material. The body has a front and a back forming a base for the body, the front having an outer surface with a convex shape and the back having a cavity that extends from the base into the body. In one example, the cavity has an inner surface with a first section and a second section that curve, respectively, with positive concavity and with negative concavity relative to a point at which the centerplane and the base intersect with one another. The inner surface and the outer surface define a material thickness for the body that increases from a first value at the centerplane to a second value in the second section that forms a thickness ratio with the first value that reaches a maximum value in a range from about 2.4 to about 3.6.

Other features and advantages of the disclosure will become apparent by reference to the following description taken in connection with the accompanying drawings.

BRIEF DESCRIPTION OF THE DRAWINGS

Reference is now made briefly to the accompanying drawings, in which:

FIG. 7 depicts a perspective view of the lighting device of FIG. 6 in exploded form.

Where applicable like reference characters designate identical or corresponding components and units throughout the several views, which are not to scale unless otherwise indicated.

DETAILED DESCRIPTION OF THE INVENTION

Figure 1:
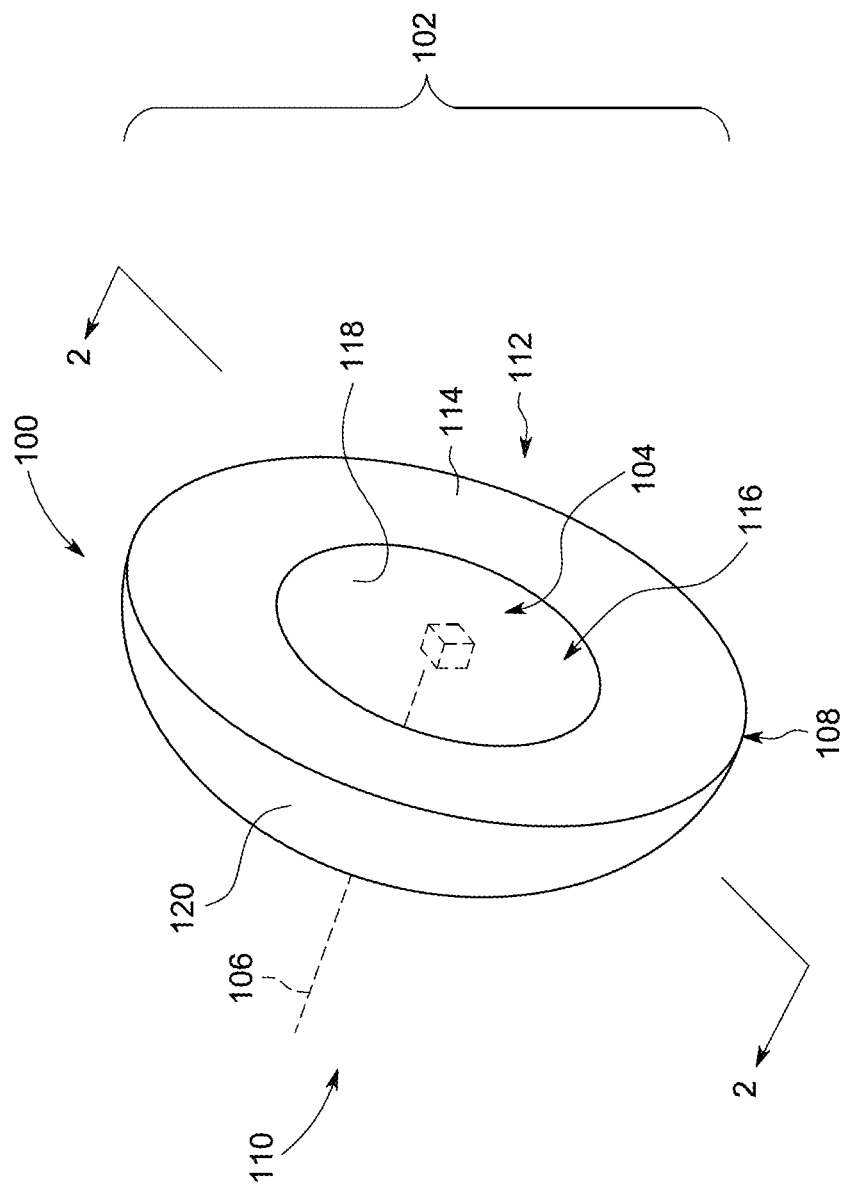
FIG. 1 depicts a perspective view of a lens element that distributes light from a light source with uniform intensity over a range from about −90° to about 90° with respect to the optical axis of the light source.

FIG. 1 depicts a perspective view of an exemplary embodiment of a lens element 100 for use in a lighting device. The lens element 100 is part of a light assembly 102 that includes the lens element 100 and a light source 104, shown in phantom lines. The light source 104 has an optical axis 106 that indicates, in one example, the general directionality of light that emanates from the light source 104. Examples of the light source 104 include light emitting diode (LED) devices and similar devices that emit light with certain defined directionality, e.g., in the direction of the optical axis 106.

As also shown in FIG. 1, the lens element 100 has a body 108 with a front 110 and a back 112 that forms a base 114. The body 108 also has a 116 on the back 112 that forms an inner surface 118. The front 110 has an outer surface 120 that forms the body 108 into a generally convex shape relative to the base 114. During operation, light from the light source 104 impinges on the inner surface 118, passes through the body 108, and emits from the outer surface 120.

Construction of the body 108 determines characteristics of the emitted light. The geometry of the inner surface 118 and the outer surface 120 in combination with other features (e.g., materials) of the body 108 can cause the light to exhibit a uniform intensity distribution. In one example, the uniform intensity distribution occurs from about −90° to about 90° with respect to the optical axis 106. As discussed more below, this disclosure also contemplates configurations of the lens element 100 that can emit light with uniform intensity distribution over other angular ranges, which may be beneficial when the lens element 100 is paired with certain structures (e.g., a heat sink) that dissipate heat from the light source 104.

Broadly, the body 108 incorporates a geometry that defines features of the inner surface 118 and the outer surface 120 to achieve this uniform intensity distribution. These features include, for example, curves, bends, arcs, and like curvilinear shapes. Collectively, the body 108 employs these features to change the direction of light that transits from the inner surface 118 to the outer surface 120. These changes can reflect, refract, and/or re-direct light, thus rendering light that emits from the lens element 120 with the light distributing characteristics, as desired.

The body 108 can comprise, for example, materials of various types and compositions including glass and/or plastics (e.g., polycarbonate) as well as similar light transmitting materials. In one example, the body 108 comprises an optically clear material, which can minimize back reflection and maintain high optical efficiency. This disclosure does, however, contemplate configurations of the lens element 100 that may benefit from material that comprises light scattering and/or reflective light scattering particles mixed within the bulk material.

Figure 2:
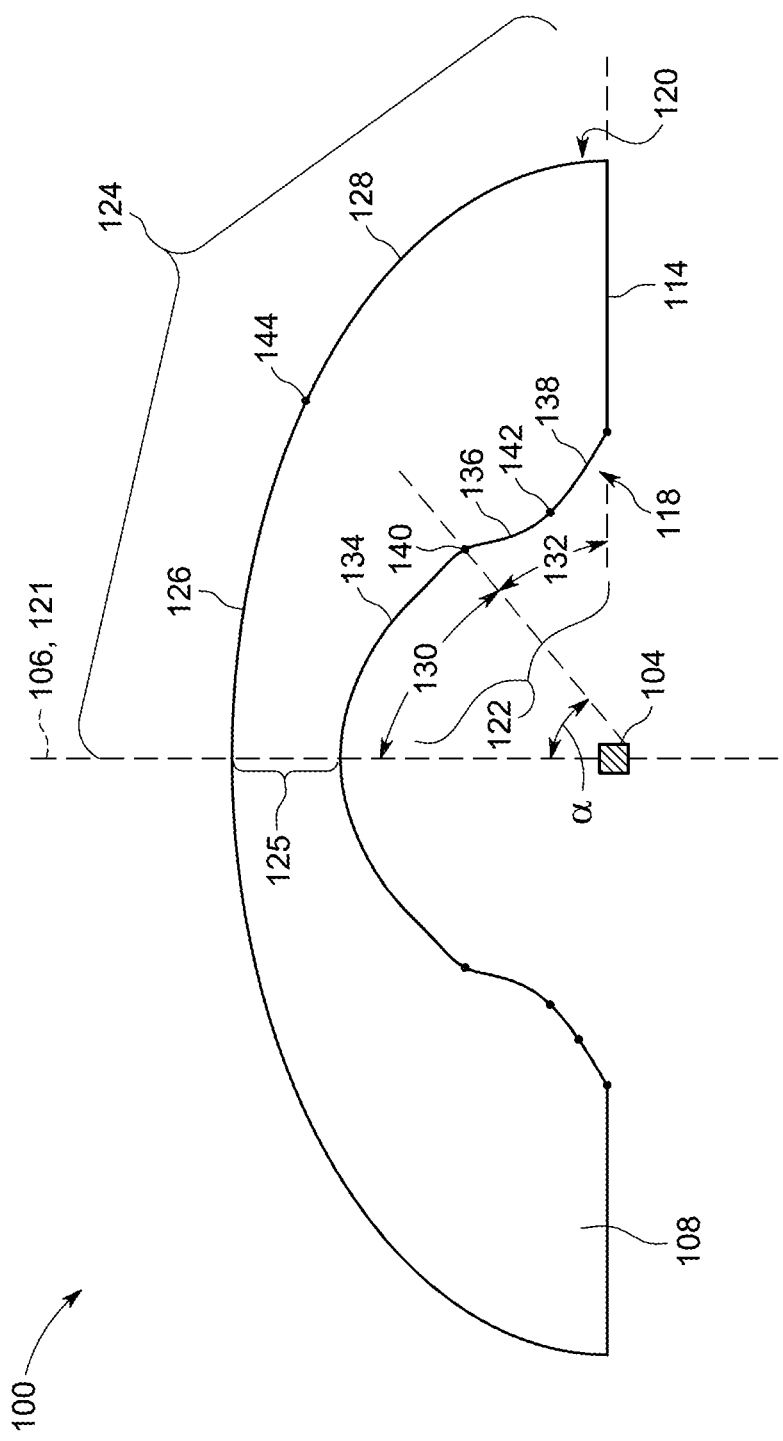
FIG. 2 depicts a top, cross-section view of the lens element of FIG. 1.

FIG. 2 depicts a cross-section of the lens element 100 taken at line 2-2 of FIG. 1. This cross-section illustrates one exemplary geometry of the inner surface 118 and the outer surface 120 that can manipulate light from the light source 104. This configuration can form the body 108 to emit light with uniform intensity over a range of from about −90° to about 90° with respect to the optical axis 106. This distribution permits use of the lens element 100 in lighting devices that replace conventional lighting devices, e.g., incandescent bulbs. Examples of lighting devices that deploy the lens element 100 can distribute light to form comfortable lighting in a manner that is more cost efficient, e.g., relative to conventional lighting devices.

The body 108 has a centerplane 121 and one or more profiles (e.g., a first profile 122 and a second profile 124) that define the shape, contour, and other features of, respectively, the inner surface 118 and the outer surface 120. Changes in the profiles 122, 124 define a material thickness 125 for the body 108 between the inner surface 118 and the outer surface 120. In one example, the material thickness 125 has a first thickness value at and/or proximate the centerplane 121 and a second thickness value that is larger than the first thickness value. The second thickness value may occur at a point along the profile 122, 124 that is angularly offset from the centerplane 121. The material thickness 125 can also have a third thickness value, proximate the base 114, that is less than the second thickness value.

In one construction, the second profile 124 can include one or more outer arcs (e.g., a first outer arc 126 and a second outer arc 128). The first profile 122 includes one or more inner sections (e.g., a first inner section 130 and a second inner section 132). The inner sections 130, 132 describe one or more inner arcs (e.g., a first inner arc 134, a second inner arc 136, and a third inner arc 138). The first section 130 and the second section 132 may share a transition point 140.

The pair of outer arcs 126, 128 and a pair of the inner arcs 136, 138 may each share a common tangent (e.g., generally designated at and/or proximate a first common tangent 142 and a second common tangent 144). The common tangents 142, 144 describe a point (and/or a plurality of points) where a first adjacent arc touches and/or intersects with a second adjacent arc and where a first tangent to the first adjacent arc at the point and a second tangent to the second adjacent are at the point have the same slope. This feature of the outer arcs 126, 128 and the inner arcs 136, 138 can permit continuous curvature of the second section 132 of first profile 122 of the inner surface 118 and the second profile 124 of the outer surface 120. In the illustration of FIG. 2, for example, the second inner arc 136 transitions to the third inner arc 138 at the second common tangent 142, and the first outer arc 128 transitions to the second outer arc 130 at the second common tangent 144.

The first profile 122 and the second profile 124 define the curvature of the surfaces 118, 120 of the lens element 100. For example, the outer surface 120 has a first curvature that causes the outer surface 120 to curve away from the light source 104. This curve forms the convex shape of the body 108. The inner surface 118 has a second curvature and a third curvature that correspond to, respectively, the first section 130 and the second section 132. As shown in FIG. 2, the second curvature may be different than the third curvature. Examples of the curvatures can have positive concavity and negative concavity. In the example of FIG. 2, the inner surface 118 in the first section 130 has positive concavity in which the second curvature causes the inner surface 118 to curve away from light source 104. The inner surface 118 has negative concavity in the second section 132 in which the inner surface 118 curves towards the light source 104.

Changes in the curvature of the first profile 122 and the second profile 124 can determine the first value and the second value for the material thickness 125. This change in the material thickness 125 may be reflected as the ratio (also "thickness ratio") of the second value relative to the first value. In one example, the thickness of the body 108 increases from the centerplane 121 to a point angularly offset from the centerplane at which the inner surface 118 and the outer surface 120 are farthest apart. At this point, the thickness ratio can have a maximum value of about 3 and, in one example, the maximum value is in a range of from about 2.4 to about 3.6. As shown in the example of FIG. 2, the maximum value may occur between the first profile 122 and the second profile 124 in the second section 132. In one example, the material thickness increases to the maximum value and decreases from the maximum value to a third value proximate the base 114 that is less than the maximum value. This construction affords the lens element with properties that causes the uniform intensity distribution, as contemplated herein.

As shown in FIG. 2, in one embodiment, the centerplane 121 may form a line of symmetry for the body 108, separating the body 108 into symmetric halves. Constructions of the lens element 100 may use this line of symmetry to set out the geometry for the body 108. For example, aspects of geometry that this disclosure presents for the body 108 on one side of the centerplane 121 may also apply to the other side as well. In one example, the first section 130 crosses the centerplane 121 to define the geometry of the inner surface 118 on both sides of the centerplane 121. The first section 130 covers a portion of the inner surface 118, extending from the centerplane 121 to the first common tangent 140. In one example, the first common tangent 140 is angularly offset from the centerplane 121 by an angle $\alpha$ of about 30° or more as measured from the centerplane 121. The second section 132 includes the remaining portion of the inner surface 118, e.g., the portion of the inner surface 118 over an angle $\beta$ of about 90°-$\alpha$.

Exemplary geometry for the arcs (e.g., outer arcs 126, 128 and the inner arcs 134, 136, 138) define the amount, direction, and other features of the curvature, i.e., whether the surfaces 118, 120 have positive concavity and/or negative concavity. The arcs can have a radius that extends from a centerpoint with coordinates that define the position of the centerpoint relative to the light source 104. Variations in one or more of the coordinates and the radius can modify the curvature. These modifications can, in turn, tune the body 108 to reflect, refract, and re-direct light in a manner that causes the light element 100 to emit light with one or more of the light distributing characteristics contemplated herein.

Figure 3:
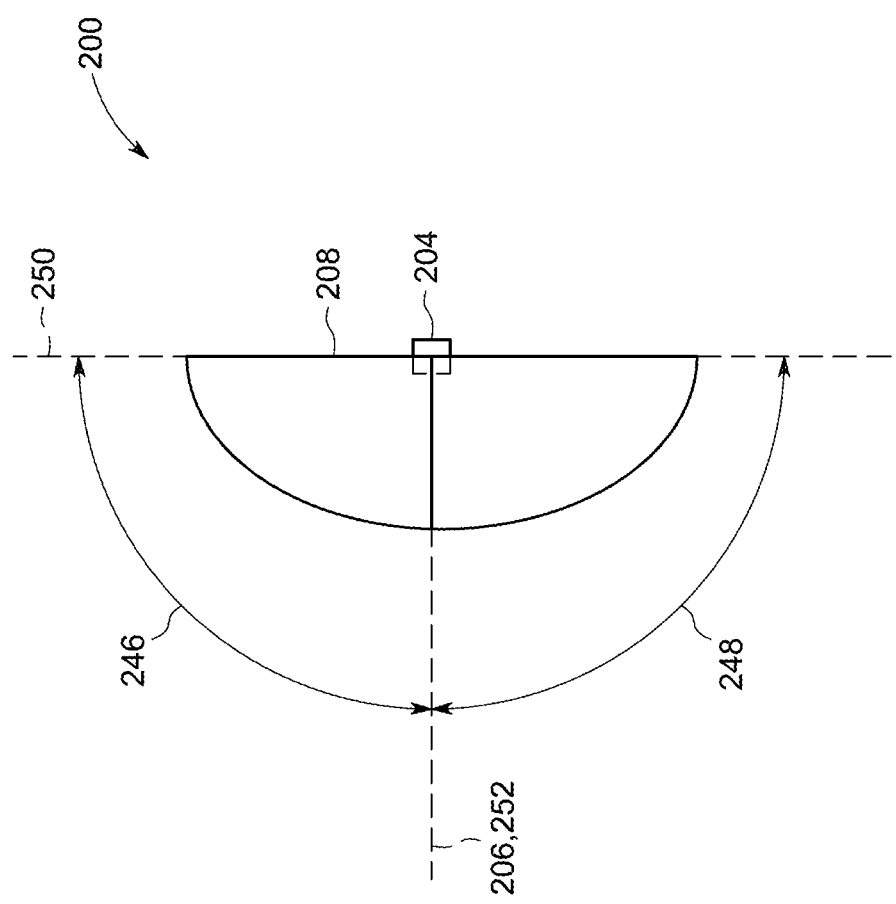
FIG. 3 depicts a side view of the lens element of FIG. 3.

FIG. 3 illustrates a side view of an exemplary embodiment of a lens element 200 that emits light with uniform intensity distribution from about −90° to about 45° with respect to the optical axis 206 when paired with a heat sink for dissipating waste heat generated by the light source 204. The lens element 200 can include or more dispersing regions (e.g., a first dispersing region 246 and a second dispersing region 248). The regions 246, 248 associate a part of the body 208 with, respectively, a first light dispersing characteristic and a second light dispersing characteristic for light that emanates from the lens element 200. These parts of the body 208 cover an angle measured from a first plane 250, which is perpendicular to the optical axis 206 of the light source 204, to a second plane 252 that defines a boundary between the dispersing regions 246, 248.

Selection of geometry for the body 208 can determine the angle and/or position of the boundary. In one embodiment, the angle for the first dispersing region 246 and the second dispersion region 248 are about 90°. This disclosure does, however, contemplate configurations of the lens element 200 in which the angles for the regions 246, 248 can vary within a range of from about 90° to about 115°, thus allowing the lens element 200 to produce a uniform distribution over a different angular range with respect to the optical axis 206.

Figure 4:
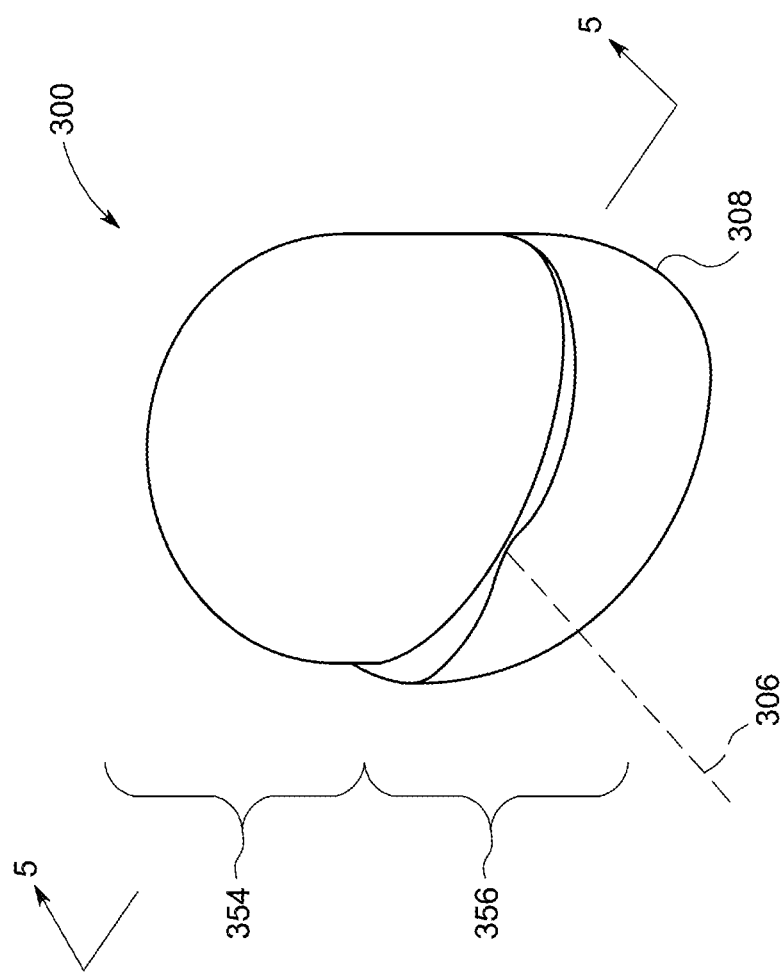
FIG. 4 depicts a perspective view of an exemplary embodiment of a lens element that can distribute light from a light source with uniform intensity from in a range from about −90° to about 45° with respect to the optical axis of the light source.
Figure 5:
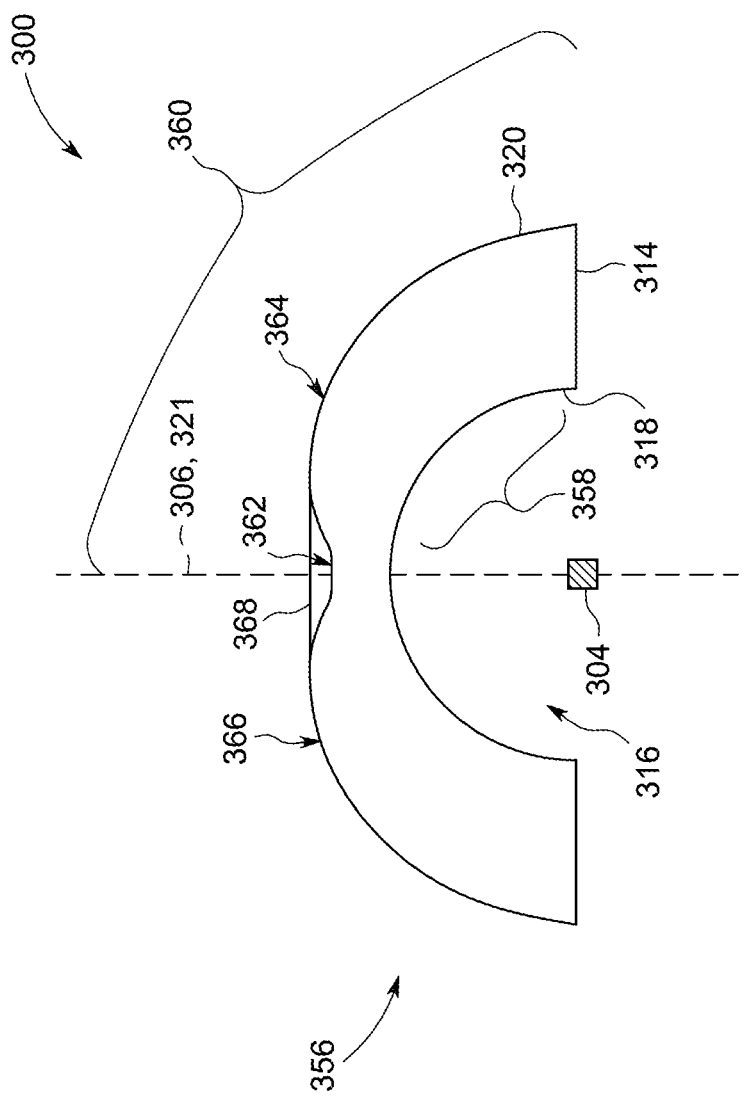
FIG. 5 depicts a top, cross-section view of the lens element of FIG. 3.

FIGS. 4 and 5 illustrate an exemplary embodiment of a lens element 300 with construction to implement a pair of distinct dispersing regions. This configuration allows the lens element 300 to emit light about −90° to about 45° with respect to the optical axis 306 when paired with a heat sink for dissipating waste heat generated by the light source (e.g., light source 104, 204). FIG. 4 illustrates a perspective view of the lens element 300. The body 308 has a bi-furcated lens configuration that includes an upper lens element 354 and a lower lens element 356. In one example, the upper lens element 354 can distribute light with uniform intensity distribution from about −90° to about 0° with respect to the optical axis of the lens and the lower lens element 356 can distribute light with uniform intensity distribution from about 0° to about 45° with respect to the optical axis of the lens.

FIG. 5 depicts a top, cross-section view of the lens element 300 taken at line 5-5 of FIG. 4. This view illustrates one exemplary configuration that affords the lower lens element 356 with optical properties to distribute light with a uniform intensity distribution from about 0° to about 45° with respect to the optical axis 306. In FIG. 5, the lower lens element 356 has a third profile 358 and a fourth profile 360 that define the shape, contour, and other features of, respectively, the inner surface 318 and the outer surface 320. Examples of the third profile 358 form the inner surface 318 as a generally arcuate shape with a radius of constant value. The centerpoint of the radius may reside proximate the LED device 304 and/or at a point at which the centerplane 321 intersects with the base 314. The fourth profile 360 defines a concave region 362 proximate the centerplane 321 and one or more convex regions (e.g., a first convex region 364, a second convex region 366, and a third convex region 368). The convex regions 364, 366, 368 are disposed about the periphery of the concave region 362, thus forming a depression in the outer surface 320.

Figure 6:
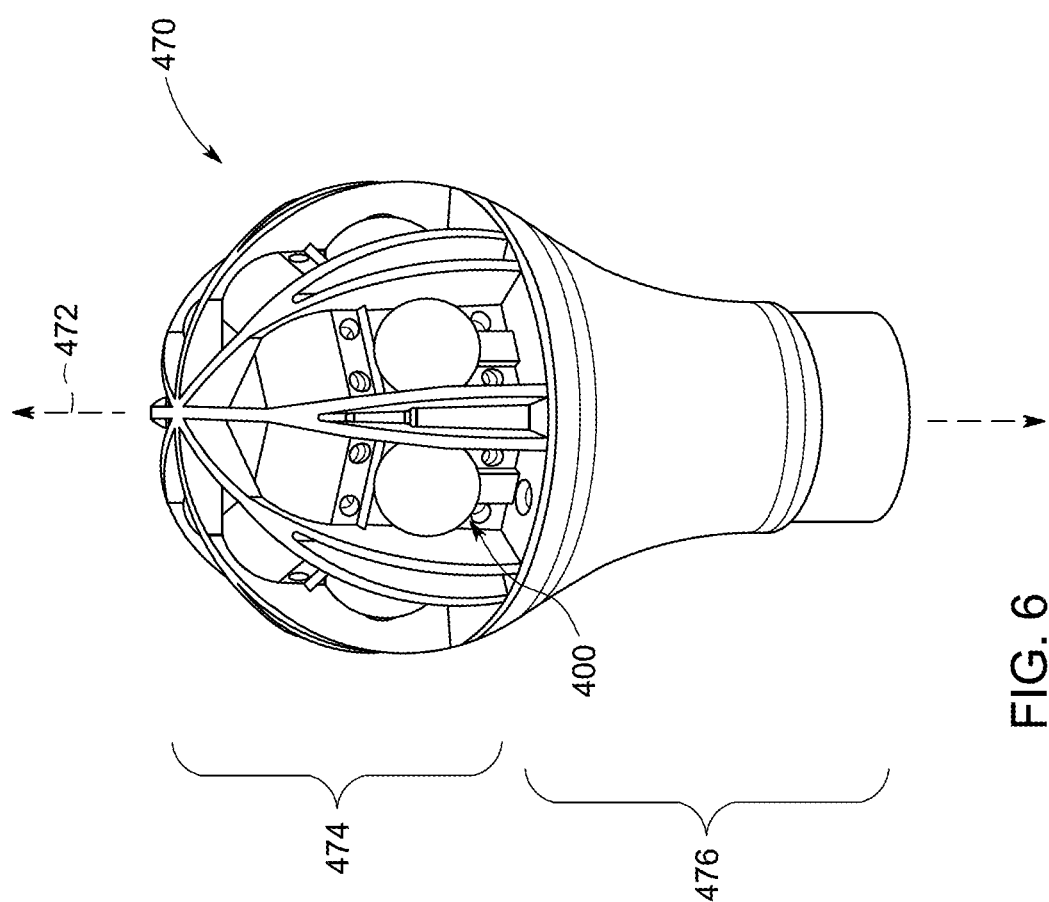
FIG. 6 depicts a perspective view of an exemplary embodiment of a lens element as part of a lighting device.

FIGS. 6 and 7 illustrate a perspective view of an exemplary embodiment of a lens element 400 as part of a lighting device 470. FIG. 6 depicts the lighting device 470 in assembled form. The lighting device 470 has a longitudinal axis 472, an upper section 474, and a lower section 476. As best shown in the exploded view of FIG. 7, the upper section 474 includes one or more heat sink components (e.g., a first heat sink component 478 and a second heat sink component 480) and a lighted array 482 that has a plurality of light assemblies 402 disposed circumferentially about the longitudinal axis 472. The lower section 476 includes a base assembly 484 with a body 486 that terminates at a connector 488. The body 486 and the connector 488 may house a variety of electrical components and circuitry that drive and control the light source 404. Examples of the connector 488 are compatible with Edison-type lamp sockets found in U.S. residential and office premises as well as other types of sockets and connectors that conduct electricity to the components of the lighting device 470, e.g., to illuminate the light source 404 in the light assemblies 402.

Construction of the lens element 400 can accommodate the structure of the heat sink components 478, 480. For example, and as shown in FIGS. 6 and 7, the lens element 400 can have flat and/or planar surfaces on the lateral sides of the body element. The flat surfaces allow the lens element to fit between parts of the heat sink component 478, 480. Use of the lens element 400 as part of the lighted array 482 allows the lighting device 470 to generate light using LED devices 404 that is comparable with conventional incandescent bulbs, but at much less operating costs.

As used herein, an element or function recited in the singular and proceeded with the word "a" or "an" should be understood as not excluding plural said elements or functions, unless such exclusion is explicitly recited. Furthermore, references to "one embodiment" of the claimed invention should not be interpreted as excluding the existence of additional embodiments that also incorporate the recited features.

This written description uses examples to disclose embodiments of the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A lighting device, comprising:
    a light source comprising a light emitting diode (LED) device with an optical axis; and
    a lens element proximate the LED device, the lens element having a base, an inner surface, and an outer surface, the inner surface and the outer surface defining a material thickness for the lens element, the inner surface having a first section that curves with positive concavity relative to the LED device and a second section that curves with negative concavity relative to the LED device,
    wherein the inner surface comprises a first inner arc and a second inner arc that curve with negative concavity relative to the LED device,
    wherein the first inner arc and the second inner arc have, respectively, a first inner radius and a second inner radius that is different from the first inner radius,
    wherein the inner surface comprises a third inner arc that curves with positive concavity relative to the LED device, and wherein the third inner arc has a third inner radius that is different from the first inner radius and the second inner radius;
    wherein the material thickness between the inner surface and the outer surface increases from a first value proximate the optical axis to a second value that forms a thickness ratio with the first value in a range from about 2.4 to about 3.6 and decreases from the second value to a third value that is less than the second value proximate a base of the lens element.

2. The lighting device of claim 1, wherein the first section of the inner surface crosses the optical axis of the LED device.

3. The lighting device of claim 1, wherein the first section of the inner surface extends from the optical axis to a point on the inner surface that is angularly offset from the optical axis by a first angle of about 30° or greater.

4. The lighting device of claim 1, wherein the second inner arc and the third inner arc terminate at a first common tangent.

5. The lighting device of claim 1, wherein the outer surface comprises a first outer arc and a second outer arc having, respectively, a first outer radius and a second outer radius that is different from the first outer radius.

6. The lighting device of claim 1, wherein the second value occurs at a point at which the inner surface curves with negative concavity.

7. The lighting device of claim 1, wherein the lens comprises a upper lens element and a lower lens element, wherein the lower lens element has an inner surface with a radius of constant value.

8. The lighting device of claim 7, wherein the upper lens element is formed integrally with the lower lens element.

9. A lens for use in a lighting device to distribute light from a light emitting diode (LED) device with uniform intensity, said lens comprising:
    a body comprising an optically clear material, the body having a front and a back forming a base for the body, the front having an outer surface with a convex shape and the back having a cavity that extends from the base into the body,
    wherein the cavity has an inner surface with a first section and a second section that curve, respectively, with positive concavity and with negative concavity relative to a point at which the centerplane and the base intersect with one another, and
    wherein the inner surface and the outer surface define a material thickness for the body that increases from a first value proximate the centerplane to a second value that forms a thickness ratio with the first value that reaches a maximum value in a range from about 2.4 to about 3.6.

10. The lens of claim 9, wherein the body has a centerplane that separates the body into symmetric halves, and wherein the first section crosses the centerplane.

11. The lens of claim 9, wherein the body forms an upper lens element and a lower lens element, and wherein the cavity in the lower lens element has a radius of constant value relative to the point.

12. A lighting device, comprising:
    a light source comprising a light emitting diode (LED) device with an optical axis; and
    a lens element proximate the LED device, the lens element having a base, an inner surface, and an outer surface, the inner surface and the outer surface defining a material thickness for the lens element, the inner surface having a first section that curves with positive concavity relative to the LED device and a second section that curves with negative concavity relative to the LED device,
    wherein the material thickness between the inner surface and the outer surface increases from a first value proximate the optical axis to a second value that forms a thickness ratio with the first value in a range from about 2.4 to about 3.6 and decreases from the second value to a third value that is less than the second value proximate a base of the lens element; and
    wherein the outer surface comprises a first outer arc and a second outer arc having, respectively, a first outer radius and a second outer radius that is different from the first outer radius.

13. The lighting device of claim 12, wherein the lens element distributes light with a uniform intensity distribution over a range of about −90° to about 90° with respect to the optical axis.

14. The lighting device of claim 12, further comprising a heat sink component having a first member and a second member disposed on either side of the lens element.

* * * * *